US006687151B2

(12) United States Patent
Endo et al.

(10) Patent No.: US 6,687,151 B2
(45) Date of Patent: Feb. 3, 2004

(54) VOLTAGE GENERATION CIRCUIT FOR SELECTIVELY GENERATING HIGH AND NEGATIVE VOLTAGES ON ONE NODE

(75) Inventors: Toru Endo, Kawasaki (JP); Shoichiro Kawashima, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/308,073

(22) Filed: Dec. 3, 2002

(65) Prior Publication Data

US 2003/0146741 A1 Aug. 7, 2003

(30) Foreign Application Priority Data

Feb. 7, 2002 (JP) ....................................... 2002-030206

(51) Int. Cl.[7] ................................................ G11C 11/00
(52) U.S. Cl. ........................ 365/145; 365/149; 365/226
(58) Field of Search ................................ 365/145, 149, 365/226; 327/200

(56) References Cited

U.S. PATENT DOCUMENTS 6,101,119 A * 8/2000 Yi et al. ..................... 365/149

* cited by examiner

*Primary Examiner*—Shawn Riley
(74) *Attorney, Agent, or Firm*—Arent Fox Kintner Plotkin & Kahn PLLC

(57) ABSTRACT

An output node NO is, on one hand, connected through a PMOS transistor TP1 and an NMOS transistor TN1 to ground, and on the other hand, connected through a PMOS transistor TP2 and an NMOS transistor TN2 to a node N6 which is selectively set to ground and VDD. The output node NO is connected through a capacitor C1 to the input of a driving inverter 11 in order to step-up or step-down the voltage of the output node NO. When the output node NO is set to −1V, the control circuit 10 turns off the PMOS transistors TP1 and TP2. It is also allowed to connect the output node through a first PMOS transistor to a second PMOS transistor whose back gate is connected to a power supply voltage VDD, and to connect the back gate of the first PMOS transistor to one end of a current path thereof on the side of the second PMOS transistor.

19 Claims, 17 Drawing Sheets

VOLTAGE GENERATION CIRCUIT FOR SELECTIVELY GENERATING HIGH AND NEGATIVE VOLTAGES ON ONE NODE

CROSS-REFERENCE TO RELATED APPLICATIONS

This application is based upon and claims the benefit of priority from the prior Japanese Patent Application No. 2002-30206, filed in Feb. 7, 2002, the entire contents of which are incorporated herein by reference.

BACKGROUND OF THE INVENTION

1. Field of the Invention

The present invention relates to a voltage generation circuit for selectively generating a voltage higher than a power supply voltage and a negative voltage on one node.

2. Description of the Related Art

FIG. 15 is a diagram showing a prior art 2T2C-type ferroelectric memory circuit.

A memory cell 1 consists of an NMOS transistor 2 and a ferroelectric capacitor CF1 connected in series between a bit line BL and a plate line PL, and an NMOS transistor 3 and a ferroelectric capacitor CF2 connected in series between a bit line /BL and the plate line PL. The control gates of the NMOS transistors 2 and 3 are connected to a word line WL. Each of the ferroelectric capacitors CF1 and CF2 consists of two opposite electrodes and a ferroelectric film inserted therebetween.

In a case writing a bit ‘1’ in this memory cell 1, the following operation is performed.

The bit lines BL and /BL are set to the power supply voltage VDD and 0V, respectively, and the voltage of the word line WL is raised to turn on the NMOS transistors 2 and 3. A positive pulse is supplied to the plate line PL to perform the following operation. When the plate line PL is at 0V, a polarization denoted by an arrow shown in FIG. 15 is generated across the ferroelectric capacitor CF1. Thereafter, the plate line PL becomes the power supply voltage VDD, and a polarization denoted by another arrow which is the opposite direction to the polarization across the capacitor CF1 is generated across the ferroelectric capacitor CF2. Then, the plate and word lines PL and WL return to 0V, and in this state, a residual polarization exists across each of the ferroelectric capacitors CF1 and CF2.

In a case reading this data from the memory cell 1, the following operation is performed.

The bit lines BL and /BL have been already precharged to 0V. The word line WL rises to a high, turning on the NMOS transistors 2 and 3, and simultaneously the plate line PL rises to the power supply voltage VDD. This causes a transfer of charges from the ferroelectric capacitors CF1 and CF2 to the bit lines BL and /BL, raising the voltages of bit lines BL and /BL to the amount of ΔVH and ΔVHL, respectively. The rise of the plate line PL causes a reversal in the polarization of the ferroelectric capacitor CF1, but not in the polarization of the ferroelectric capacitor CF2. Therefore, the transferred charge of the ferroelectric capacitor CF1 is larger than that of the ferroelectric capacitor CF2, resulting in ΔVH>ΔVL. A sense amplifier 4 is activated to amplify the voltage difference ΔVH−ΔVL, thereby bringing the bit lines BL and /BL to the power supply voltage VDD and 0V, respectively. The plate line PL falls to 0V, performing a restore operation in which the polarization of the ferroelectric capacitor CF1 is reversed to return to the original state. The sense amplifier 4 becomes inactive, and the bit lines BL and /BL are set to 0V by a precharge circuit not shown in the figure. The word line WL falls to ‘L’ to turn off the NMOS transistors 2 and 3.

However, when the power supply voltage VDD is lowered to, for example, 1.5V for reducing the power consumption, the amount of charges transferred to the bit lines BL and /BL is reduced, resulting in lowering the voltage difference ΔVH−ΔVL between the bit lines BL and /BL, and thereby increasing the possibility of reading errors.

To cope with this, if a voltage higher than the power supply voltage VDD or a negative voltage is applied to the plate line PL, instead of the power supply voltage VDD or 0V, respectively, the voltages applied to the ferroelectric capacitors CF1 and CF2 are raised and the voltage difference between the bit lines BL and /BL in reading operation, is raised, consequently reducing the possibility of reading errors.

However, as shown in FIG. 16, a negative-voltage generation circuit 5 and a high-voltage generation circuit 6 are separated in the prior art. Therefore, when the high voltage and the negative voltage are output through one output node NO (PL), it is necessary to connect the outputs of the negative-voltage generation circuit 5 and the high-voltage generation circuit 6 through an NMOS transistor 7 and a PMOS transistor 8, respectively, to the output node NO, consequently complicating the configuration as explained below.

In such a configuration, when a control signal SC inputted to the control gates of the transistors 7 and 8 is low, the transistors 7 and 8 are OFF and ON, respectively, thereby applying a high voltage VH to the output node NO. On the other hand, when the control signal SC is high, the transistors 7 and 8 are ON and OFF, respectively, thereby applying a negative voltage VL to the output node NO.

However, both kinds of transistors exist in one chip: one kind thereof receiving a usual power supply voltage VDD, and the other kind thereof receiving a negative voltage VL. Therefore, in order not to allow a current to flow between the source and the back gate of the NMOS transistor 7, the NMOS transistor 7 should be formed in a triple-well structure as shown in FIG. 17(A) so that the back gate is reverse-biased. For this reason, the manufacturing process of the semiconductor chip becomes complicated, resulting in raising the cost. FIG. 17(B) shows a vertical cross-sectional view of a usual CMOS, in which only a PMOS transistor is formed in twin-well structure and an NMOS transistor has a simple structure in comparison with the NMOS transistor 7 of FIG. 17(A).

SUMMARY OF THE INVENTION

Accordingly, it is an object of the present invention to provide a voltage generation circuit having normal transistors of simple structure.

In one aspect of the present invention, there is provided a voltage generation circuit for selectively generating a low voltage lower than a first power supply voltage and a high voltage higher than a second power supply voltage on an output node on the basis of the first and second power supply voltages, the second power supply voltage being higher than the first power supply voltage, the voltage generation circuit comprising:

- a first PMOS transistor, having a current path and a control gate, a first end of the current path being connected to the output node, a back gate thereof being connected to a second end of the current path;

a first NMOS transistor, having a current path and a control gate, a first end of the current path thereof being connected to the second end of the current path of the first PMOS transistor, a second end of the current path thereof being connected to the first power supply voltage;

a first capacitor, having first and second electrodes, the first electrode being connected to the output node;

a second PMOS transistor, having a current path and a control gate, a first end of the current path thereof being connected to the output node, a back gate thereof being connected to a second end of the current path thereof, the control gate thereof being connected to the first power supply voltage;

a second NMOS transistor, having a current path and a control gate, a first end of the current path thereof being connected to the second end of the current path of the second PMOS transistor; and a control circuit.

The control circuit:

raises the second electrode of the first capacitor to the second power supply voltage to step up the output node to the high voltage from a first state where the first and second NMOS transistors are OFF and where the output node and the second electrode of the first capacitor are at the second and first power supply voltages, respectively; and lowers the second electrode of the first capacitor to the first power supply voltage to step down the output node to the low voltage from a second state where the first and second NMOS transistors are OFF, where a voltage between the control gate and the second end of the current path of each of the first and second PMOS transistors is equal to an absolute value of a threshold voltage thereof, and where the output node and the second electrode of the first capacitor are at the first and second power supply voltages, respectively.

According to the above configuration, when the output node is at the low voltage, the voltage between the control gate and the second end of the current path of each of the first and second PMOS transistors is equal to the threshold voltage thereof. Therefore, these PMOS transistors can be turned off by employing the first and second NMOS transistors of twin-well structure, thereby reducing the manufacturing cost of a semiconductor chip on which the voltage generation circuit is formed, as well as simplifying the structure of the circuit.

In another aspect of the present invention, there is provided a voltage generation circuit for selectively generating a low voltage lower than a first power supply voltage and a high voltage higher than a second power supply voltage on an output node on the basis of the first and second power supply voltages, the second power supply voltage being higher than the first power supply voltage, the voltage generation circuit comprising:

a first PMOS transistor, having a current path and a control gate, a first end of the current path being connected to the output node, a back gate thereof being connected to a second end of the current path;

a second PMOS transistor, having a current path and a control gate, the control gate thereof being connected to the control gate of the first PMOS transistor, a first end of the current path thereof being connected to the second end of the current path of the first PMOS transistor, a back gate thereof being connected to the second power supply voltage;

a first capacitor, having first and second electrodes, the first electrode being connected to the output node; and a control circuit.

The control circuit:

raises the second electrode of the first capacitor to the second power supply voltage to step up the output node to the high voltage in a first state where the first and second PMOS transistors are OFF and where the output node and the second electrode of the first capacitor are at the second and first power supply voltages, respectively; and lowers the second electrode of the first capacitor to the first power supply voltage to step down the output node to the low voltage in a second state where the first and second PMOS transistors are OFF and where the output node and the second electrode of the first capacitor are at the first and second power supply voltages, respectively.

According to the above configuration, when the output node is at the low voltage, the first and second PMOS transistors are OFF. Therefore, only normal transistors in simple structure can be employed, thereby reducing the manufacturing cost of the semiconductor chip on which the voltage generation circuit is formed.

Other aspects, objects, and the advantages of the present invention will become apparent from the following detailed description taken in connection with the accompanying drawings.

DESCRIPTION OF THE PREFERRED EMBODIMENTS

Figure 1:
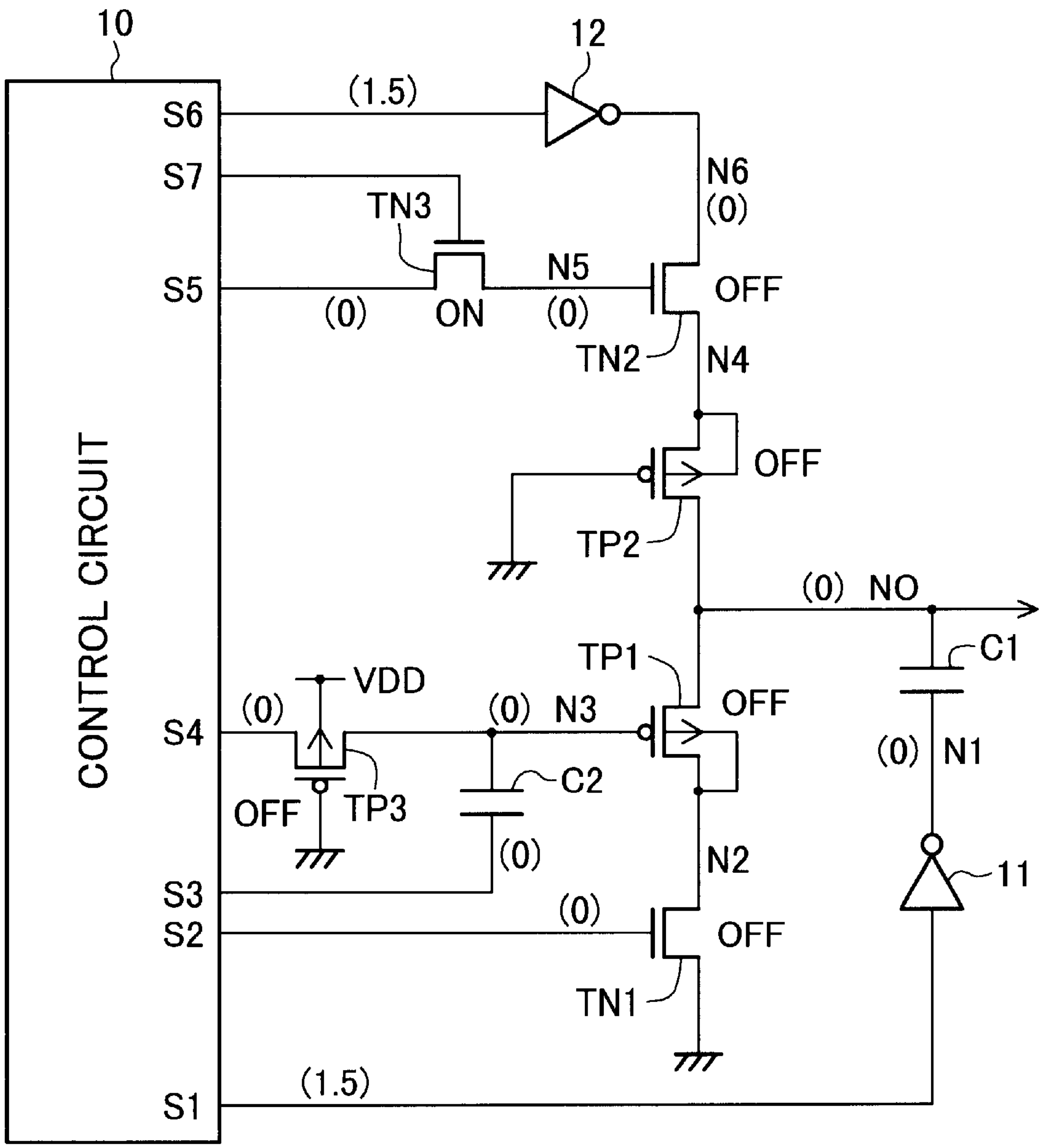
FIG. 1 is a diagram showing a voltage generation circuit according a first embodiment of the present invention.

Referring now to the drawings, wherein like reference characters designate like or corresponding parts throughout several views, preferred embodiments of the present invention are described below.

First Embodiment

FIG. 1 is a diagram showing a voltage generation circuit according a first embodiment of the present invention.

Figure 15:
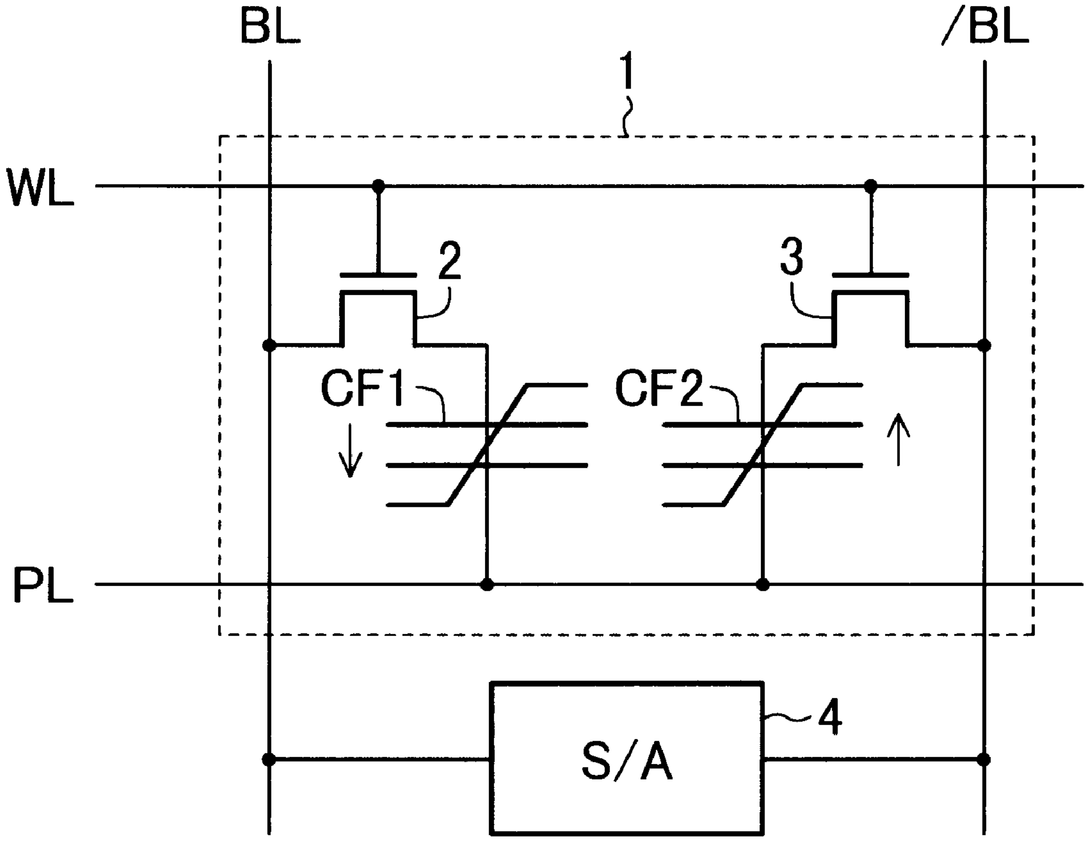
FIG.15 prior art
FIG. 15 is a diagram showing a prior art 2T2C-type ferroelectric memory circuit.
Figure 16:
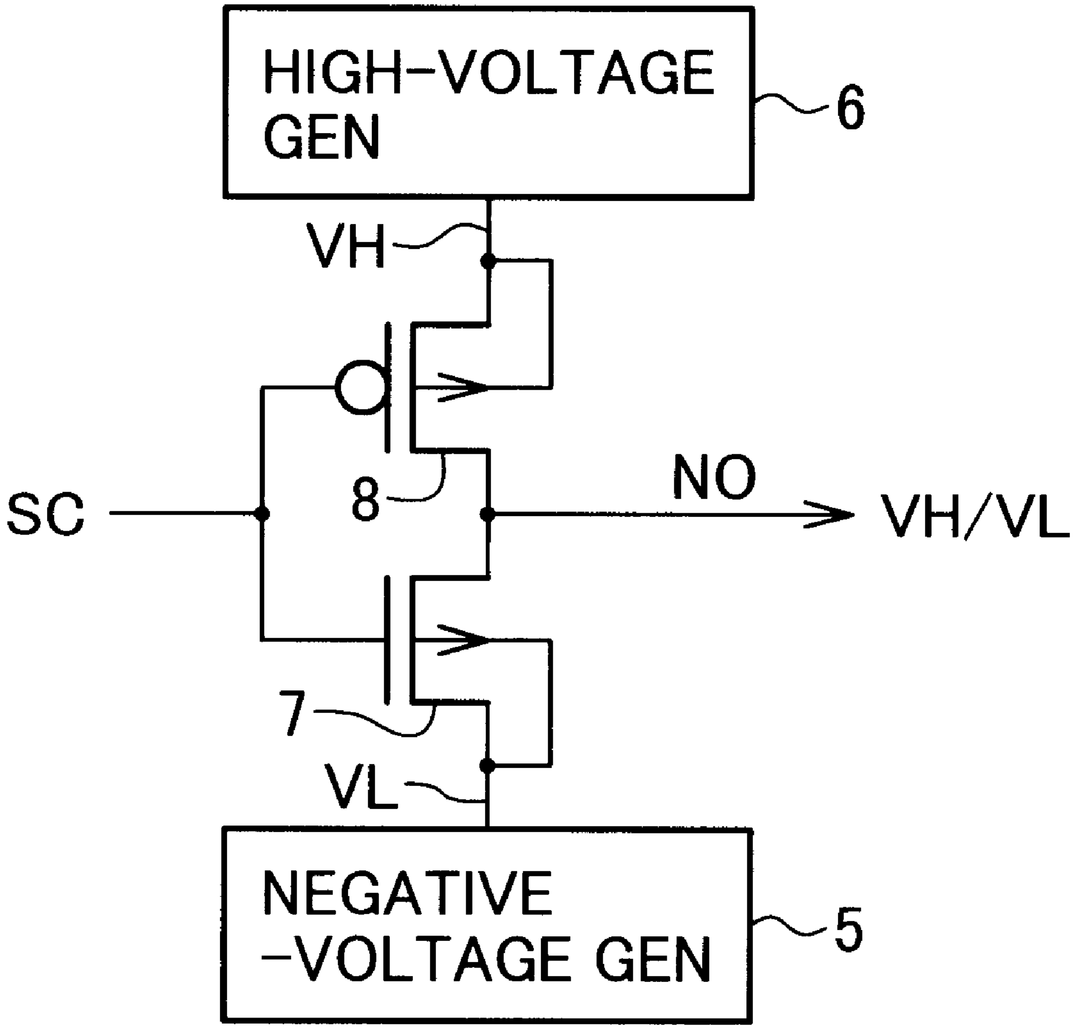
FIG.16 prior art
FIG. 16 is a diagram showing a prior art voltage generation circuit.
Figure 17A:
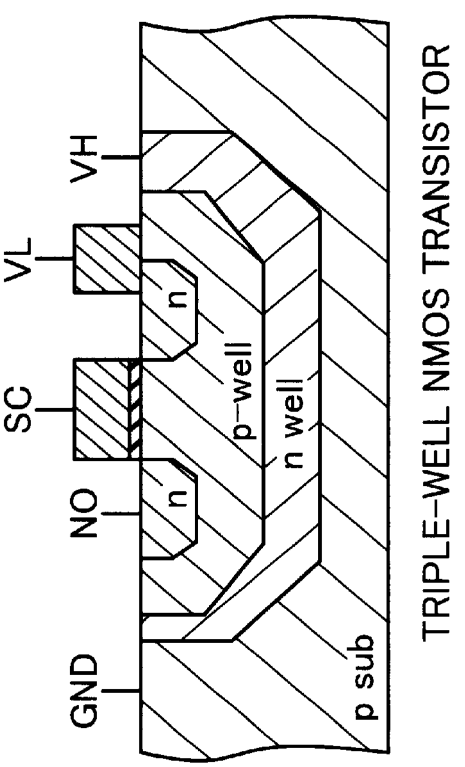
FIG.17(A) prior art
FIG. 17(A) is a vertical sectional view of a prior art NMOS transistor 7 in FIG. 16 of a triple-well structure.
Figure 17B:
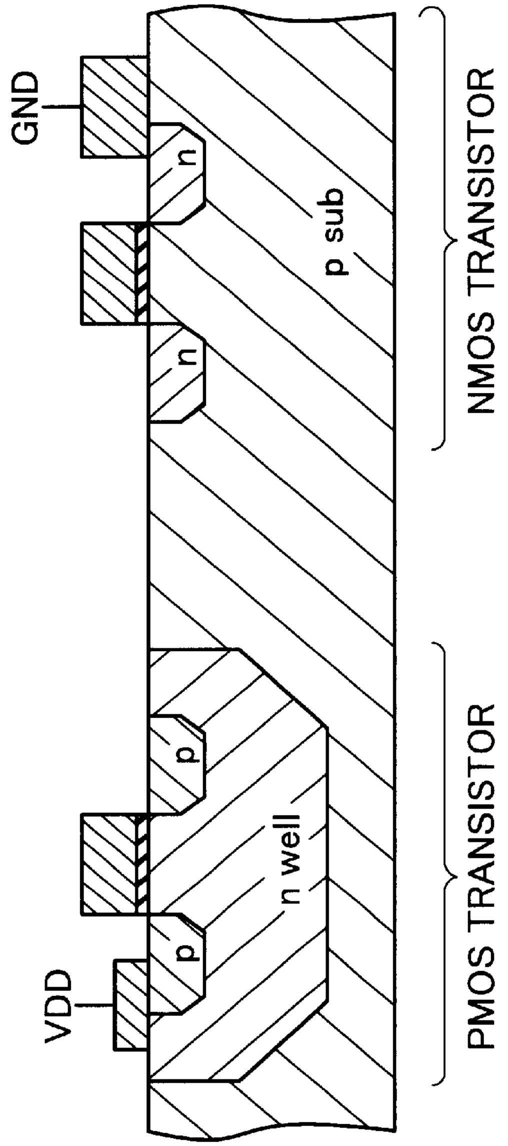
FIG.17(B) prior art
FIG. 17(B) is a vertical sectional view of a conventional structure of a normal CMOS.

This circuit is to selectively output a high voltage VH higher than a power supply voltage VDD and a negative voltage VL through an output node NO that is used as, for example, the plate line PL shown in FIG. 15. The circuit of FIG. 1 may be formed on a semiconductor chip on which the circuit of FIG. 15 is formed. The following description is made about a case where VDD=1.5V, VL=−1.0V, VH=2.5V, and PMOS and NMOS transistors have threshold voltages Vthp and Vthn equal to −0.5V and 0.5V, respectively.

A capacitor C1 is connected between the node NO and a node N1 in order to step-up or step-down the voltage of the output node NO in a floating state. The node N1 receives a control signal S1 from a control circuit 10 through a driving inverter 11.

In order to close or open a connection between the output node NO and ground, the output node NO is connected through a PMOS transistor TP1, a node N2 and an NMOS transistor TN1 to ground. A control signal S2 is provided to the control gate of the NMOS transistor TN1 from the control circuit 10. By means of causing the voltage between the control gate and source of the PMOS transistor TP1 to be equal to the threshold voltage Vthp when the output node NO is at the negative voltage VL and the control signal S2 is at 0V, it is possible to employ the NMOS transistor TN1 of a twin-well structure.

The control gate of the PMOS transistor TP1 is connected through a node N3 to one electrode of a step-down capacitor C2 so that the PMOS transistor TP1 is ON when the node NO is at 0V. The other electrode of the capacitor C2 receives a control signal S3 from the control circuit 10. A PMOS transistor TP3 is connected between the node N3 and the control circuit 10, and its control gate is connected to ground so that the node N2 rises nearly up to 0V when the output node NO is at the negative voltage VL.

In order to bring the output node NO to the power supply voltage VDD, or close the connection of a VDD supply side, the output node NO is connected through a PMOS transistor TP2, a node N4 and an NMOS transistor TN2 to a node N6. By means of causing the voltage between the control gate and source of the PMOS transistor TP2 to be equal to the threshold voltage Vthp when the output node NO is at the negative voltage VL and the control gate of the NMOS transistor TN1 is at 0V, it is possible to employ the NMOS transistor TN2 of the twin-well structure. To this end, the control gate of the PMOS transistor TP2 is connected to ground. The control gate of the NMOS transistor TN2 is connected through a node N5 and an NMOS transistor TN3 to a control signal output S5 of the control circuit S10, and the control gate of the NMOS TN3 receives a control signal S7 from the control circuit 10 so that the NMOS transistor TN2 automatically turns ON synchronously with voltage rising of the node N6, or forcibly turns OFF. The node N6 receives a control signal S6 from the control circuit 10 through an inverter 12.

The PMOS transistors TP1 to TP3 are formed in different N-wells from each other, and their back gates are connected to the nodes N2, N4 and the power supply voltage VDD, respectively. The back gates of the NMOS transistors TN1 to TN3 are a P-type substrate connected to ground.

Figure 2:
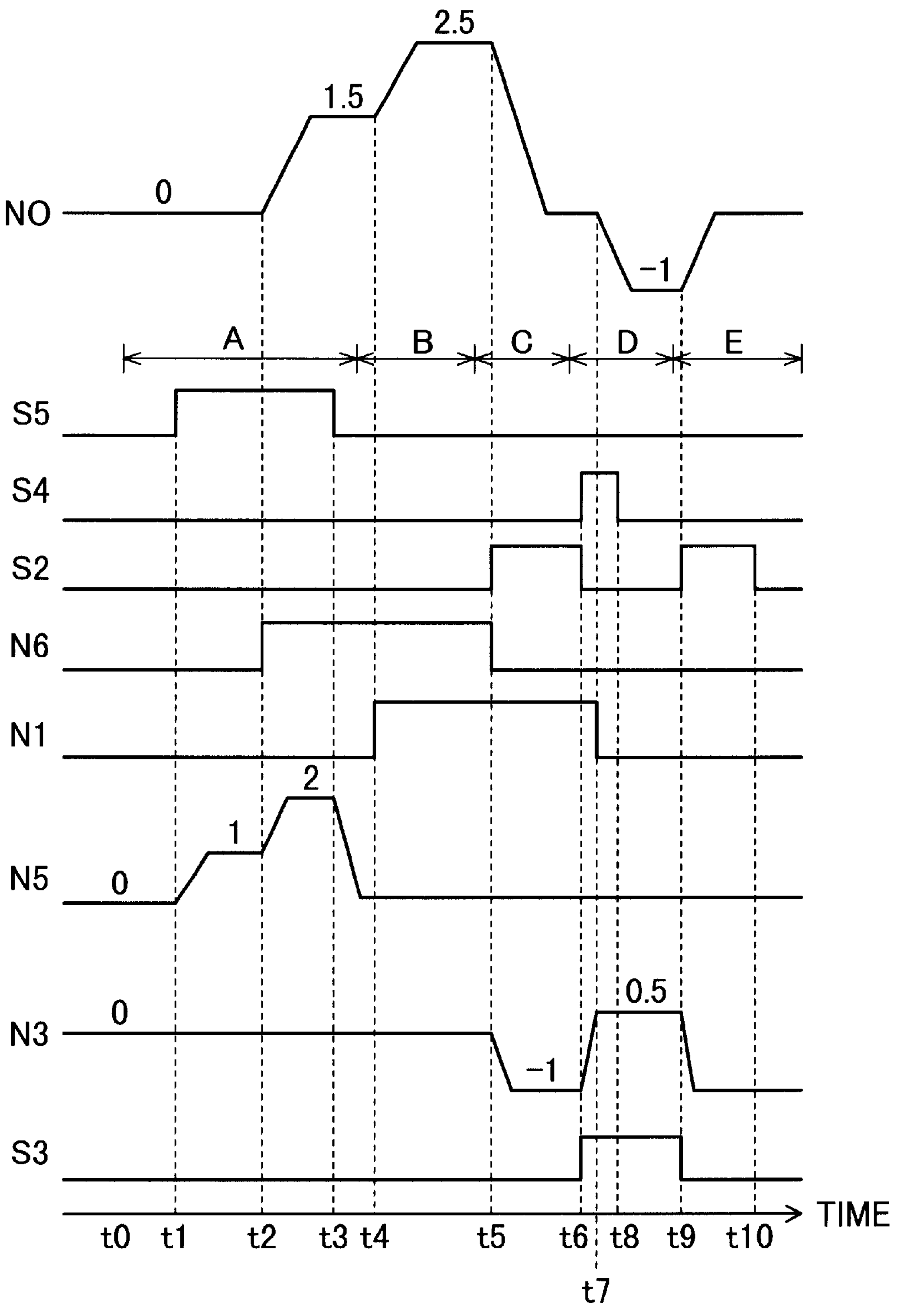
FIG. 2 is a diagram showing the voltage waveforms of signals and nodes in the circuit of FIG. 1 for explaining the operation thereof.

FIG. 2 is a diagram showing the voltage waveforms of signals and nodes in the same circuit as FIG. 1 for explaining the operation thereof.

This operation includes a preparatory step A for raising the output node NO from ground to the power supply voltage before raising it to the high voltage VH, a step B for raising the output node NO to the high voltage VH, a preparatory step C for decreasing the output node NO to 0V before decreasing it to the negative voltage VL, a step D for decreasing the output node NO to the negative voltage VL, and a step E for returning the output node NO to the initial voltage 0V. Numerals in parentheses of FIG. 1 denote the initial voltages of nodes in the step A. Numerals in parentheses of FIGS. 3 to 7 denote the final voltages of nodes in the steps A to E, respectively.

STEP A (NO: 0V→1.5V)

(t0) Initially, the control signal S1 is at 1.5V, and the node N1 is at 0V; the control signal S2 is at 0V, and the NMOS transistor TN1 is OFF; the control signals S3 and S4 and the nodes N3 and NO are at 0V, the PMOS transistor TP1 is OFF; the PMOS transistor TP2 is OFF; the control signals S5 and S7 are at 0V and 1.5V, respectively, the NMOS transistor TN3 is ON, and the node N5 is at 0V; and the control signals S6 is at 1.5V, the node N6 is at 0V, and the NMOS transistor TN2 is OFF.

(t1) The control signal S5 rises to 1.5V to raise the node N5 to 1V (=VDD−Vthn). Next, the control signal S7 falls to 0V, fully turning off the NMOS transistor TN3.

(t2) The control signal S6 falls to 0V to raise the node N6 to 1.5V. Because the node N5 is in a floating state, the voltage of the node N5 raises to 1+VDD−α1, following the voltage rise of the node N6, due to parasitic capacitance of the NMOS transistor TN2. Here, the value of α1 is in the range of 0<α1<VDD, and depends on the ratio between the parasitic capacitance of the NMOS transistor TN2 and the parasitic capacitance of the elements connected thereto. For example, α1=0.5V, and the voltage of the node N5 is at 2V. Thereby, the NMOS transistor TN2 is on while the node N4 rises up to 1.5V. The PMOS transistor TP2 is turned on, and the output node NO rises to 1.5V. The PMOS transistor TP1 is turned on and the node N2 rises to 1.5V, but because the control signal S2 is at 0V, the NMOS transistor TN1 is OFF and the output node NO remains at 1.5V.

(t3) The control signals S5 and S7 fall to 0V and 1.5V, respectively, and thereby the NMOS transistor TN3 is turned on and the node N5 falls to 0V.

Figure 3:
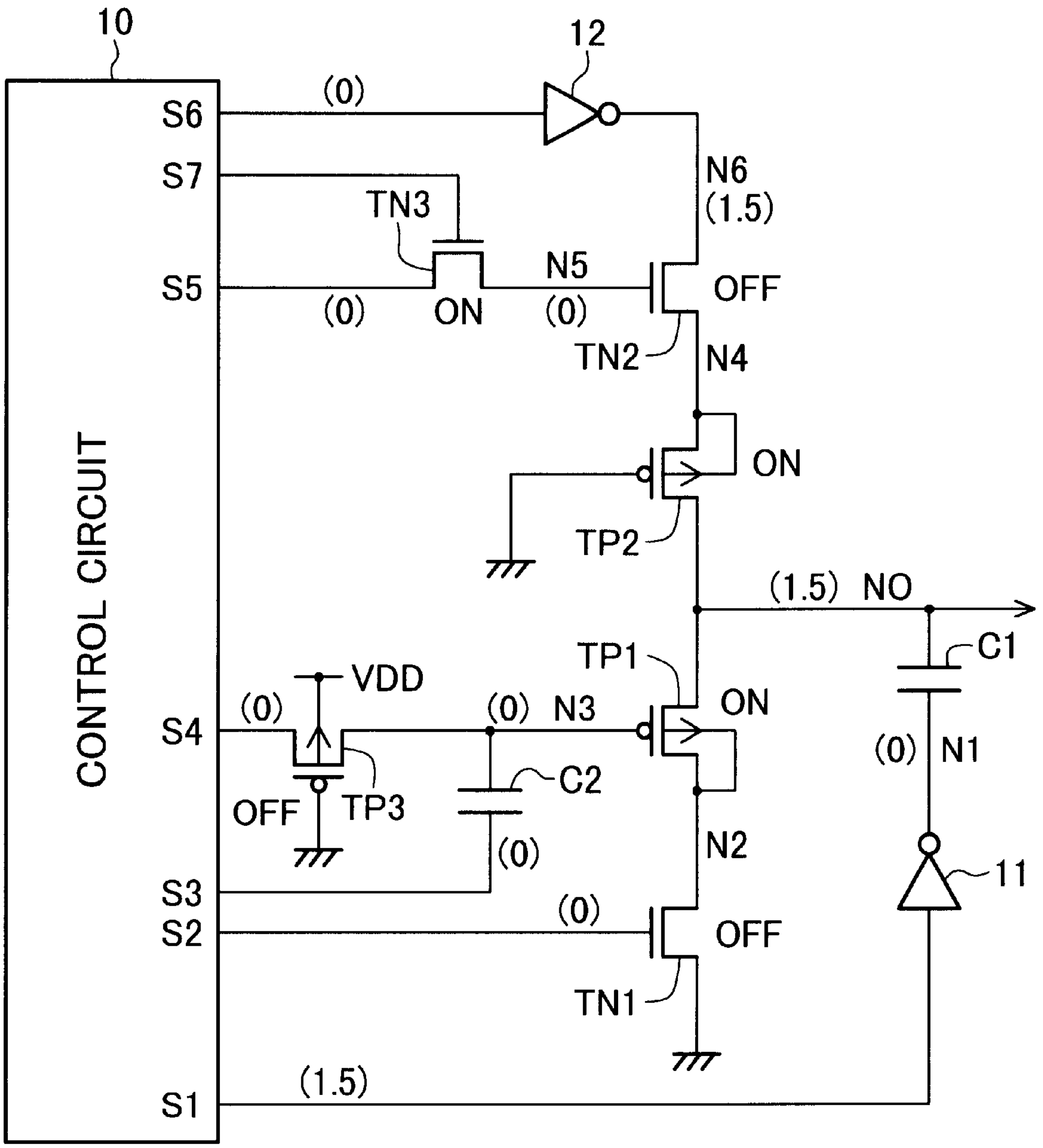
FIG. 3 is a diagram showing the voltages of nodes and the ON/OFF states of transistors in the same circuit as FIG. 1 at the end of step A of FIG. 2.

As a result of such an operation, the voltages of nodes and the ON/OFF states of transistors are set as shown in FIG. 3.

STEP B (NO: 1.5V→2.5V)

(t4) The control signal S1 falls to 0V, raising the node N1 to 1.5V. On the other hand, because the NMOS transistors TN1 and TN2 are OFF, the output node NO is in a floating state. Accordingly, following the voltage rise of the node N1, the voltage of the output node NO rises to 1.5+VDD−α2, where the value of α2 is in the range of 0<α2<VDD, and depends on the ratio between the capacitance of the capacitor C1 and the parasitic capacitance of the elements connected thereto. For example, α2=0.5V, and the voltage of the output node NO is at 2.5V. Because the PMOS transistors TP1 and TP2 are ON, the nodes N2 and N4 also rise to 2.5V while the NMOS transistors TN1 and TN2 remain OFF.

Figure 4:
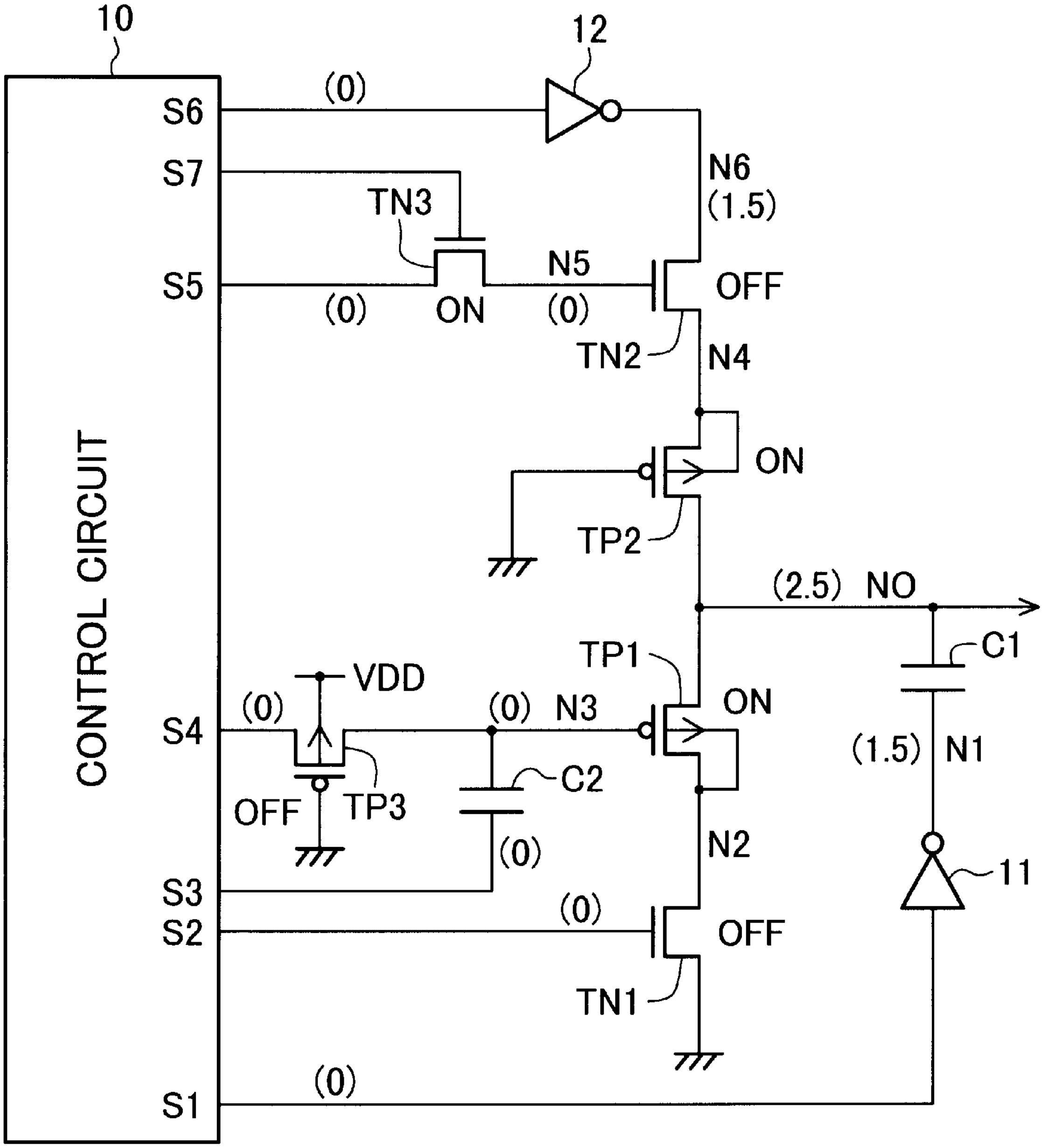
FIG. 4 is a diagram showing the voltages of nodes and the ON/OFF states of transistors in the same circuit as FIG. 1 at the end of step B of FIG. 2.

As a result of such an operation, the voltages of nodes and the ON/OFF states of transistors are set as shown in FIG. 4.

STEP C (NO: 2.5V→0V)

(t5) The control signal S2 rises to 1.5V, and thereby the NMOS transistor TN1 is turned on and the node N2 falls to 0V. The PMOS transistor TP3 is OFF, and therefore the voltage of the node N3 in a floating state falls to −α3 due to the parasitic capacitance of the control gate of the PMOS transistor TP1, following the fall in the voltage of the node N2 equal to the voltage of the back gate of the PMOS transistor TP1. Here, the value of α3 is in the range of 0<α3<VDD, and depends on the ratio between this parasitic capacitance and mainly the capacitance of the capacitor C2. For example, α3=1V, and the voltage of the node N3 is at −1V. Accordingly, the PMOS transistor TP1 is turned on, and the output node NO falls to 0V. Because the PMOS transistor TP2 is ON, the node N4 falls to 0.5V, and thereby the PMOS transistor TP2 is turned off. In addition, the control signal S6 rises to 1.5V, and thereby the node N6 falls to 0V. The NMOS transistor TN2 remains OFF.

Figure 5:
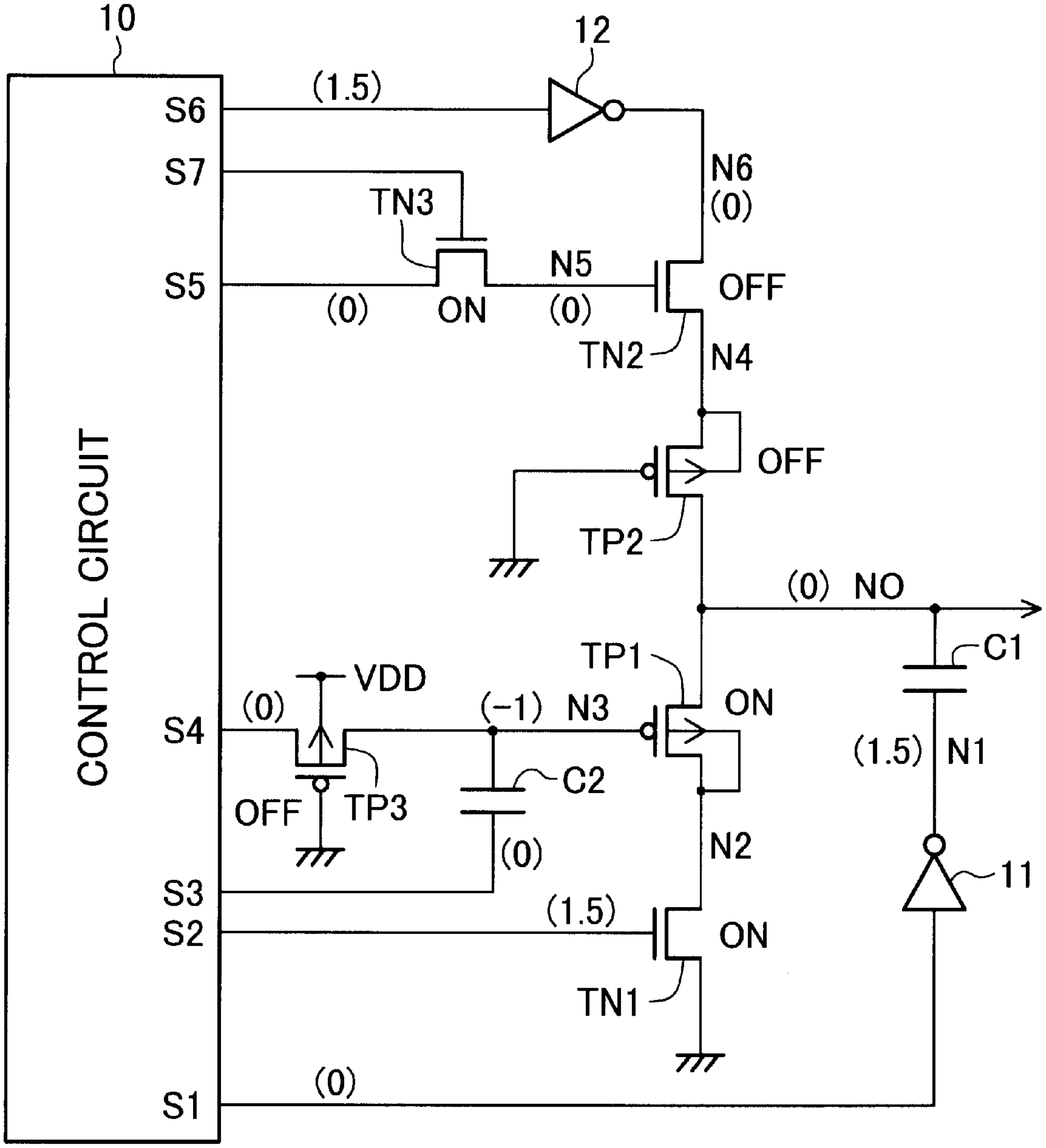
FIG. 5 is a diagram showing the voltages of nodes and the ON/OFF states of transistors in the same circuit as FIG. 1 at the end of step C of FIG. 2.

As a result of such an operation, the voltages of nodes and the ON/OFF states of transistors are set as shown in FIG. 5.

STEP D (NO: 0V→−1V)

(t6) The control signal S2 falls to 0V, thereby turning off the NMOS transistor TN1. The control signal S4 rises to 1.5V, and thereby the PMOS transistor TP3 is turned on and the node N3 rises to |Vthp|=0.5V, turning off the PMOS transistor TP3. Accordingly, the PMOS transistor TP1 is turned off. In addition, together with the control signal S4, the control signal S3 rises to 1.5V. At this time, because the PMOS transistor TP3 is ON, the node N3 does not be boosted.

(t7) The control signal S1 rises to 1.5V, and thereby the node N1 falls to 0V. At this time, because the node NO is in a floating state, its voltage falls to −1V. The PMOS transistors TP1 and TP2 remain OFF.

If the nodes N2 and N4 are shorted to the output node NO, i.e., if the PMOS transistors TP1 and TP2 do not exist, the NMOS transistors TN1 and TN2 are turned on, and a forward bias is applied between the back gate and the source of the NMOS transistor TN1, thereby allowing current to flow from the back gate to the output node NO. The NMOS transistor TN2 operates in the same manner as the NMOS transistor TN1, and thereby the node NO falls to 0V.

On the contrary, according to the first embodiment, the NMOS transistors TN1 and TN2 are OFF and their back gates are reverse-biased. Therefore, it is possible to employ the NMOS transistors TN1 and TN2 of a twin-well structure to reduce the manufacturing cost of the semiconductor chip on which the voltage generation circuit is formed.

(t8) The control signal S4 falls to 0V. At this time, the PMOS transistor TP3 remains OFF.

Figure 6:
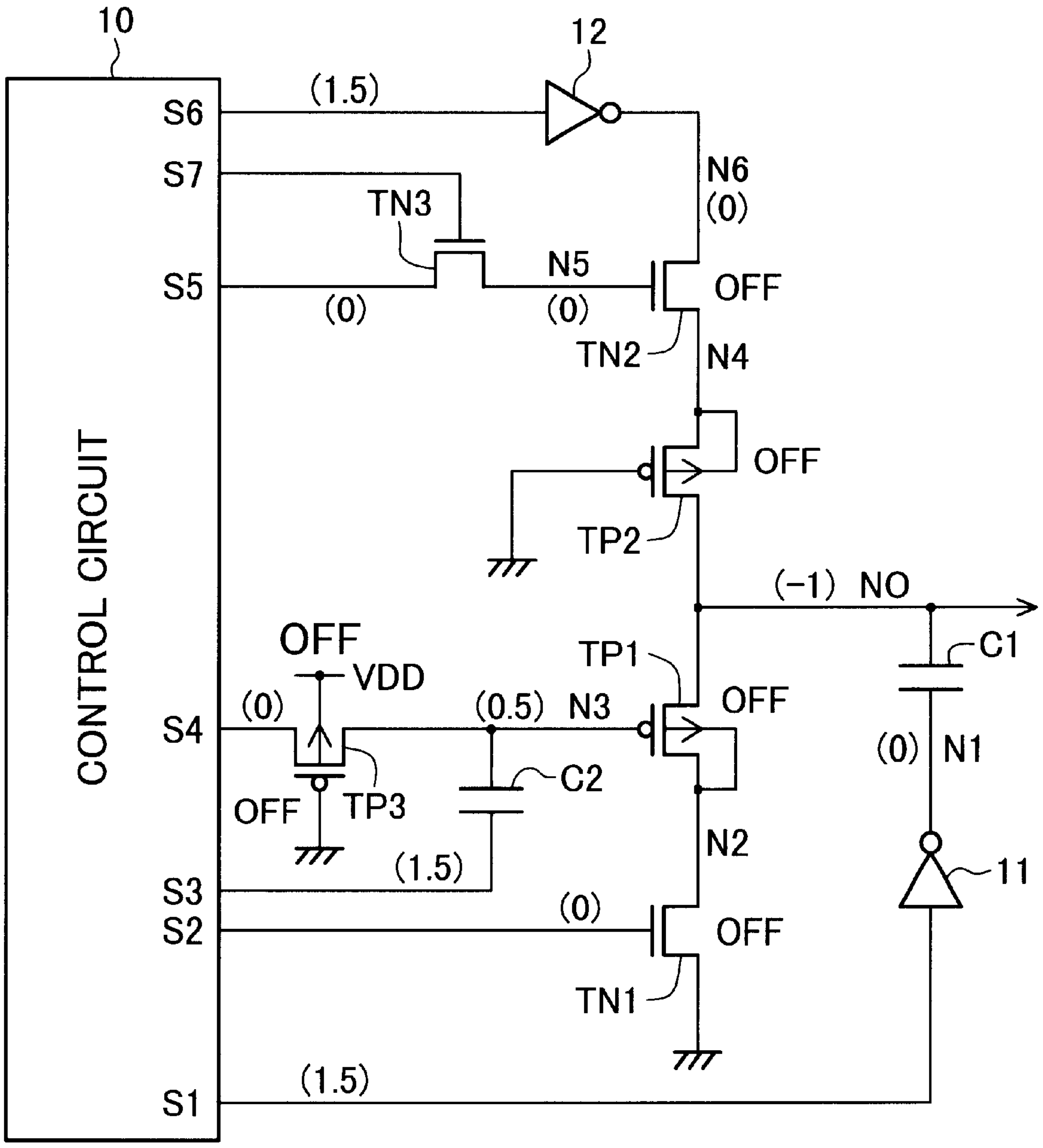
FIG. 6 is a diagram showing the voltages of nodes and the ON/OFF states of transistors in the same circuit as FIG. 1 at the end of step D of FIG. 2.

As a result of such an operation, the voltages of nodes and the ON/OFF states of transistors are set as shown in FIG. 6.

STEP E (NO:−1V→0V)

(t9) The control signal S2 rises to 1.5V, turning on the NMOS transistor TN1. In addition, the control signal S3 falls to 0V, lowering the voltage of the node N3 in a floating state to −1V. Accordingly, the PMOS transistor TP1 is turned on, raising the voltage of the output node NO to 0V. The PMOS transistor TP2 and the NMOS transistor TN2 remain OFF.

(t10) The control signal S2 falls to 0V, turning off the NMOS transistor TN1.

Figure 7:
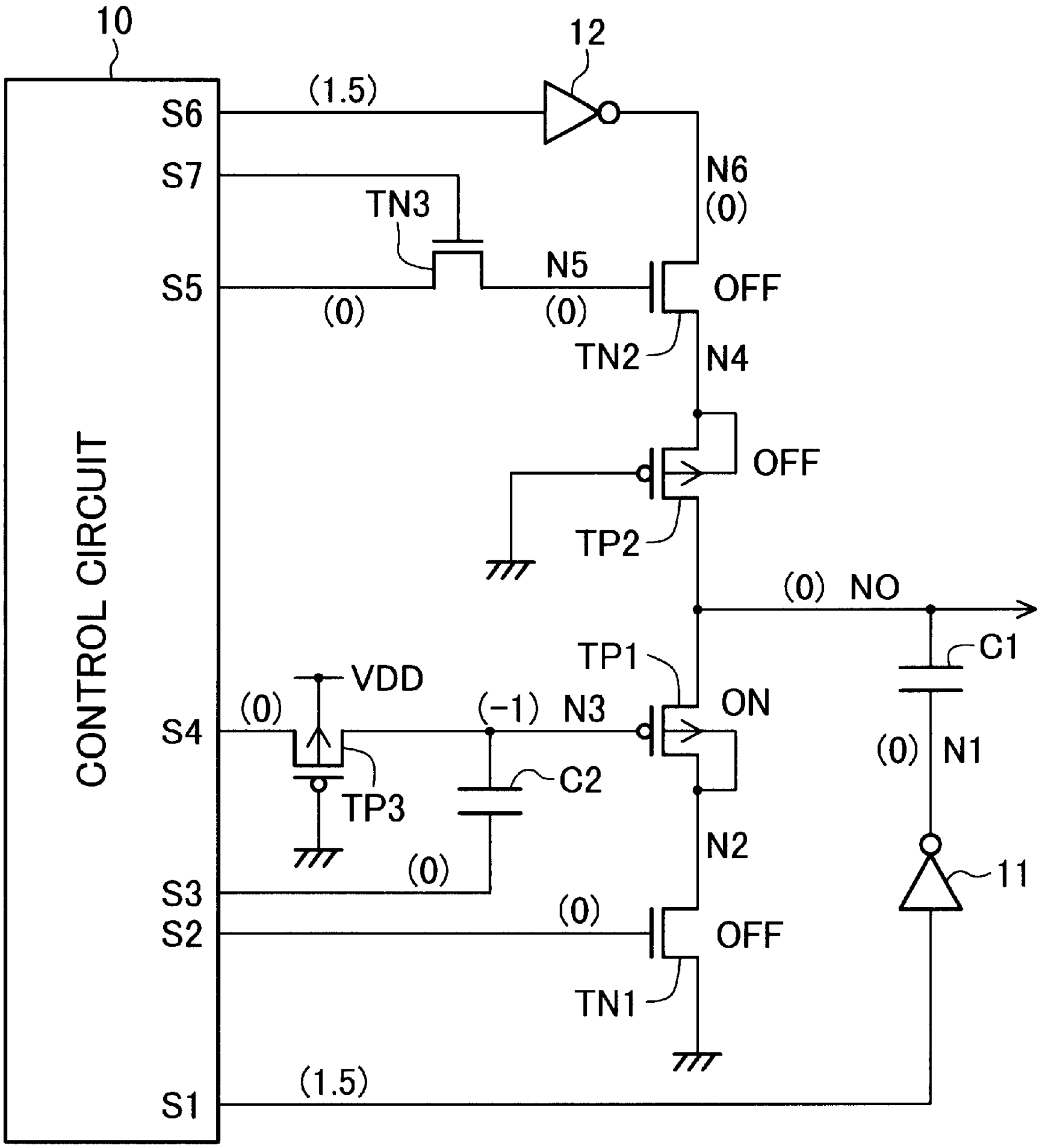
FIG. 7 is a diagram showing the voltages of nodes and the ON/OFF states of transistors in the same circuit as FIG. 1 at the end of step E of FIG. 2.

As a result of such an operation, the voltages of nodes and the ON/OFF states of transistors are set as shown in FIG. 7.

According to the first embodiment, the voltage generation circuit can be configured with employing only normal transistors of simple structure, and allows the output node to selectively output 0V, the power supply voltage VDD, the negative voltage VL, and the high voltage VH. By use of the output node NO as a plate line PL of FIG. 15, it become possible to prevent reading errors even if the power supply voltage VDD is lowered to, for example, 1.5 V since the voltage difference between the bit lines BL and /BL is made larger.

Second Embodiment

Figure 8:
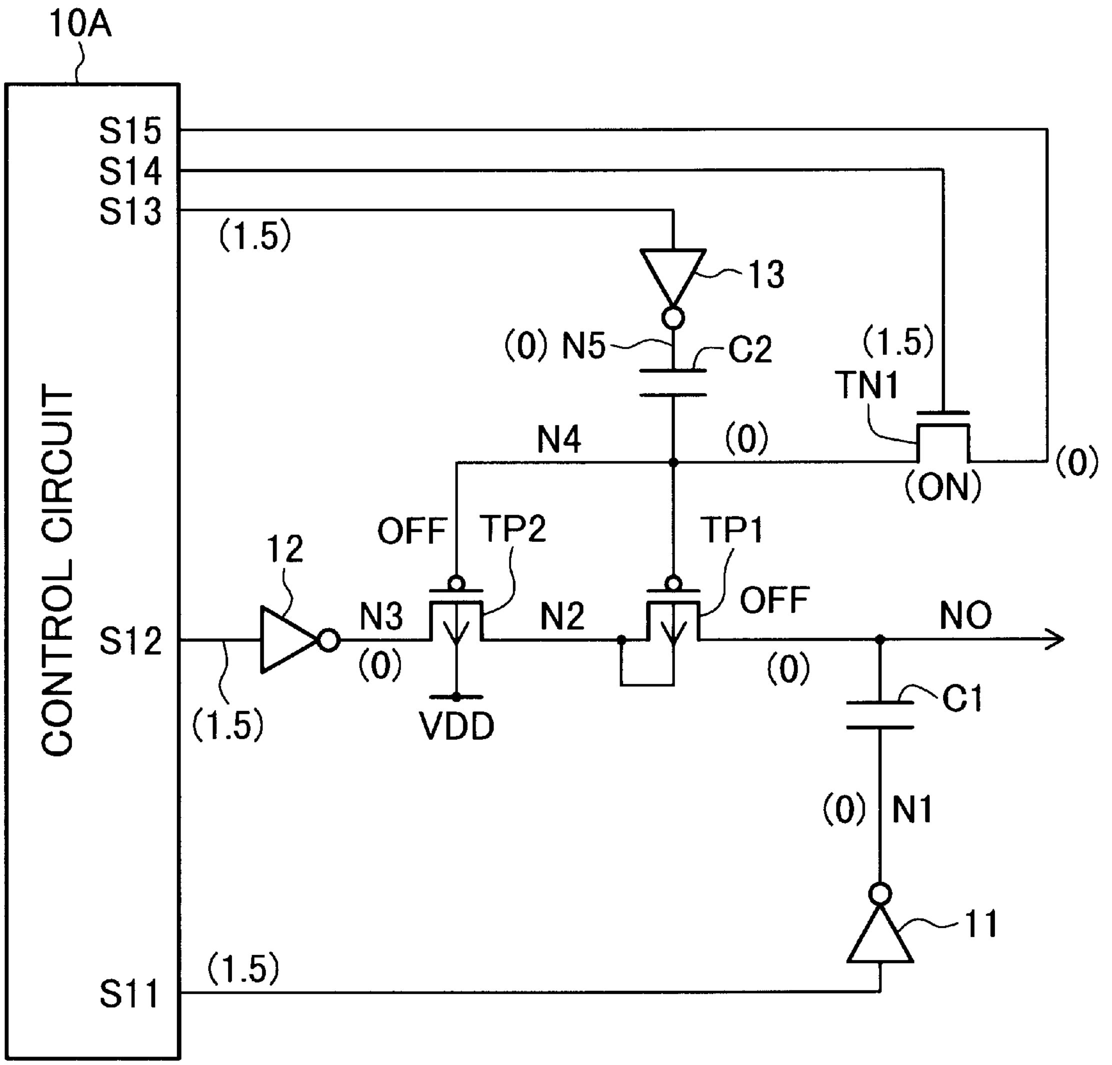
FIG. 8 is a diagram showing a voltage generation circuit according to a second embodiment of the present invention.

FIG. 8 is a diagram showing a voltage generation circuit according to a second embodiment of the present invention.

Similarly to the first embodiment, this circuit is to selectively output a high voltage VH higher than the power supply voltage VDD and a negative voltage VL through an output node NO that is used as, for example, the plate line PL shown in FIG. 15. This circuit of FIG. 8 may be formed on a semiconductor chip on which the circuit of FIG. 15 is formed.

A capacitor C1 is connected between the output node NO and a node N1 in order to step-up or step-down the voltage of the output node NO in a floating state. The node N1 receives a control signal S11 from a control circuit 10A through a driving inverter 11.

In order to bring the output node NO to the power supply voltage VDD, 0V, or a floating state, the output node NO is connected to the output of an inverter 12 through a PMOS transistor TP1, a node N2, a PMOS transistor TP2, and a node N3. The input of the inverter 12 receives a control signal S12 from the control circuit 10A. A node N4 is connected to the control gates of both the PMOS transistors TP1 and TP2. The node N4 is, on one hand, connected through an NMOS transistor TN1 to a control signal output S15 of the control circuit 10A, and on the other hand, connected through a capacitor C2 and a node N5 to the output of an inverter 13. The input of the inverter 13 and the control gate of the NMOS transistor TN1 receive control signals S13 and S14, respectively, from the control circuit 10A.

The PMOS transistors TP1 and TP2 are formed in different N wells. The back gate of the PMOS transistor TP1 is connected to one of the ends of its current path on the side of the PMOS transistor TP2. The back gate of the PMOS transistor TP2 is connected to the power supply voltage VDD. The back gate of the NMOS transistor TN1 is a P-type substrate connected to ground.

Figure 9:
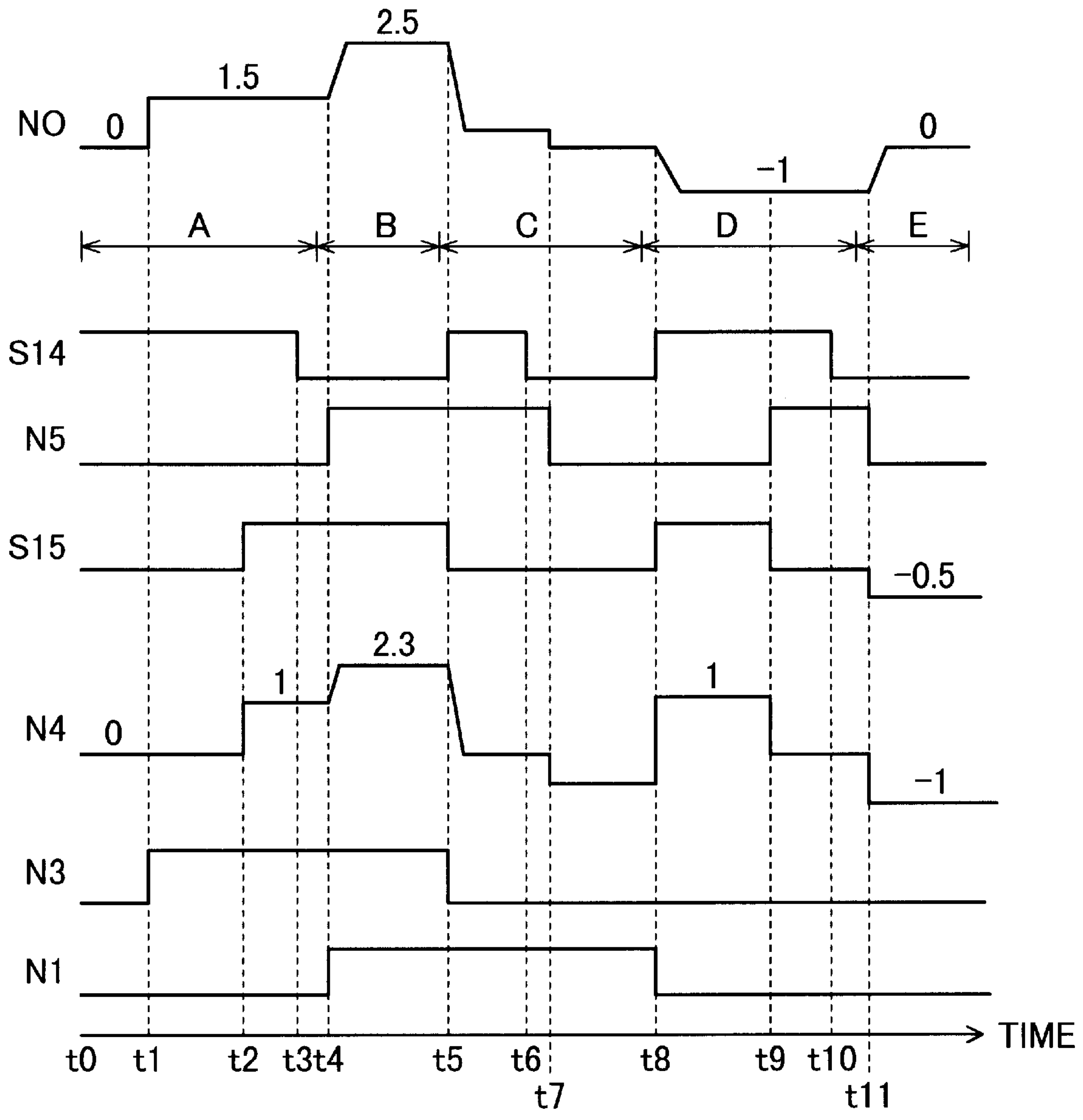
FIG. 9 is a diagram showing the voltage waveforms of signals and nodes in the circuit of FIG. 8 for explaining the operation thereof.

FIG. 9 is a diagram showing the voltage waveforms of signals and nodes in the circuit of FIG. 8 for explaining the operation thereof.

Similarly to the first embodiment, the operation includes steps A to E. Numerals in parentheses of FIG. 8 denote the initial voltages of the step A. Numerals in parentheses of FIGS. 9 to 14 denote the final voltages of nodes in the steps A to E, respectively.

STEP A (NO: 0V→1.5V)

(t0) Initially, the nodes NO and N3 are at 0V, the control signal S12 is at 1.5V, and the control signals S14 and S15 are at 1.5V and 0V, respectively, and thereby the NMOS transistor TN1 is ON, the node N4 is at 0V, and the PMOS transistors TP1 and TP 2 are OFF. The control signals S11 and S13 are at 1.5V, and thereby the nodes N1 and N5 are at 0V.

(t1) The control signal S12 falls to 0V, and thereby the node N3 rise to 1.5V, the PMOS transistor TP2 is turned on, and the node N2 rises to 1.5V. The PMOS transistor TP1 is turned on, and the output node NO rises to 1.5V.

(t2) The control signal S15 rises to 1.5V, and thereby the node N4 rises to 1.5−Vthn=1V and the NMOS transistor TN1 is turned off. Thereby the PMOS transistors TP1 and TP2 are turned off.

(t3) The control signal S14 falls to 0V, thereby fully turning off the NMOS transistor TN1.

Figure 10:
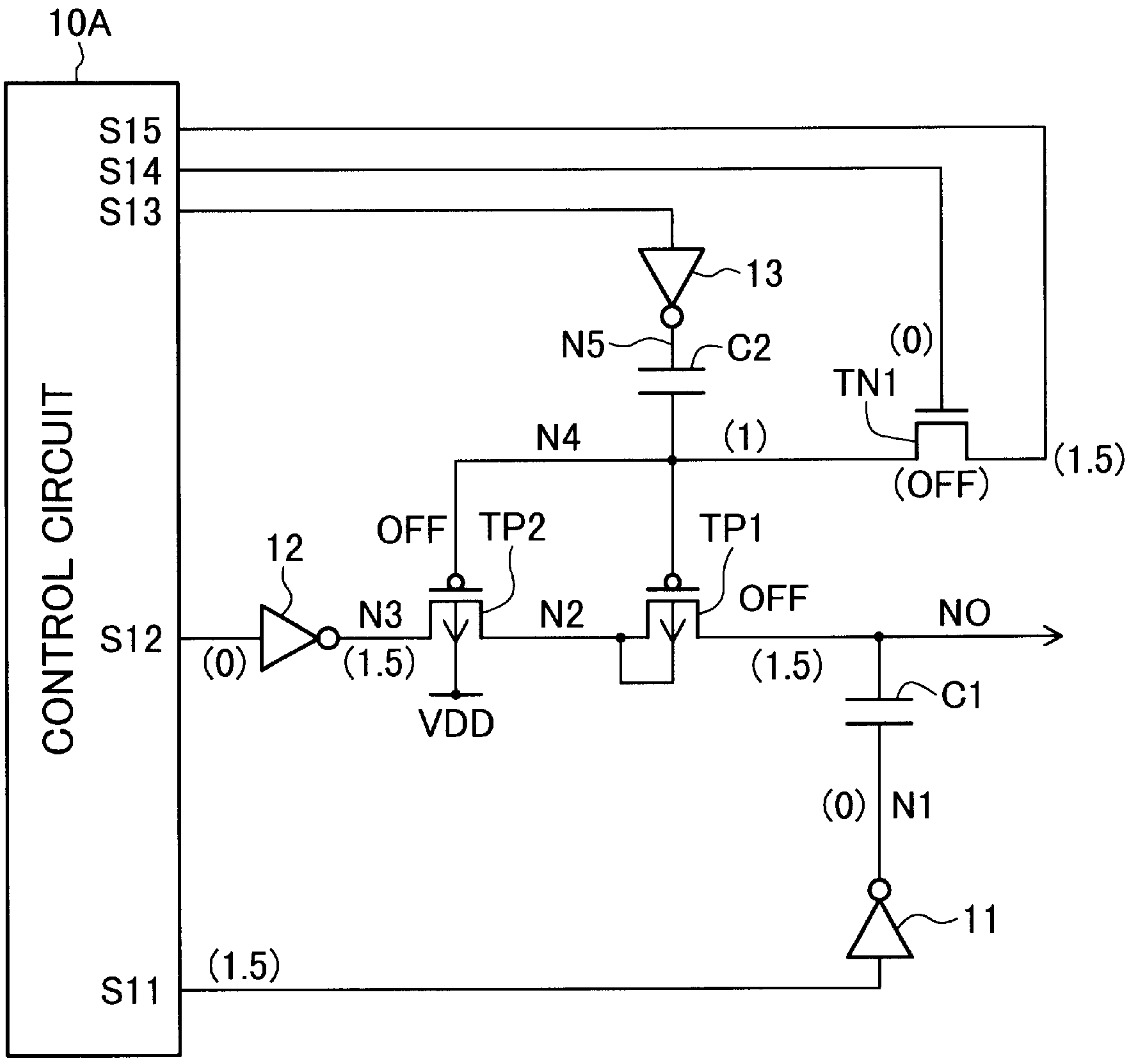
FIG. 10 is a diagram showing the voltages of nodes and the ON/OFF states of transistors in the same circuit as FIG. 8 at the end of step A of FIG. 9.

As a result of such an operation, the voltages of nodes and the ON/OFF states of transistors are set as shown in FIG. 10.

STEP B (NO: 1.5V→2.5V)

(t4) The control signal S11 falls to 0V, and thereby the node N1 rises to 1.5V, and the voltage of the output node NO rises to 1.5+VDD−α5, where the value of α5 is in the range of 0<α5<VDD and depends on the ratio between the capacitance of the capacitor C1 and the parasitic capacitance of the elements connected thereto. For example, α5=0.5V, and the voltage of the output node NO is at 2.5V. The control signal S13 falls to 0V, and thereby the node N5 rise to 1.5V and the node N4 in a floating state rises to 1+VDD−α4, where the value of α4 is in the range of 0<α4<VDD and depends on the ratio between the capacitance of the capacitor C2 and the parasitic capacitance of the elements connected thereto. For example, α4=0.2V and the voltage of the node N4 is at 2.3V.

Figure 11:
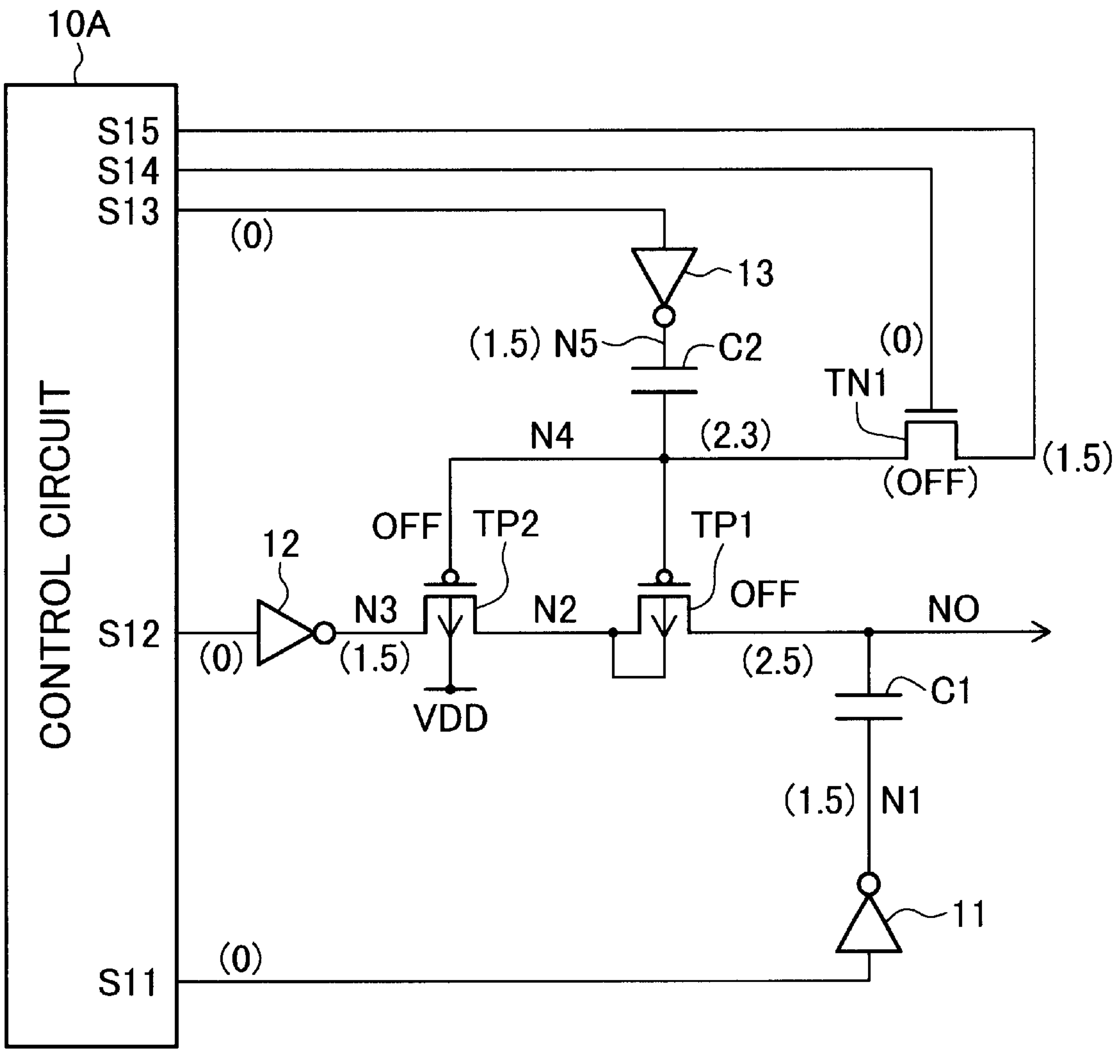
FIG. 11 is a diagram showing the voltages of nodes and the ON/OFF states of transistors in the same circuit as FIG. 8 at the end of step B of FIG. 9.

As a result of such an operation, the PMOS transistors TP1 and TP2 are fully turned off, and the voltages of nodes and the ON/OFF states of transistors are set as shown in FIG. 11.

STEP C (NO: 2.5V→0V)

(t5) The control signal S14 rises to 1.5V, and the control signal S15 falls to 0V, thereby turning on the NMOS transistor TN1, and the node N4 falls to 0V, thereby turning on the PMOS transistors TP1 and TP2. The control signal S12 rises to 1.5V, and thereby the node N3 falls to 0V. Accordingly, each of nodes N2 and NO falls to |Vthp=0.5V|, thereby turning off the PMOS transistors TP1 and TP2.

(t6) The control signal S14 falls to 0V, and thereby the NMOS transistor TN1 is turned off and the node N4 is brought into a floating state.

(t7) The control signal S13 rises to 1.5V, and thereby the node N5 falls to 0V, and following this, the node N4 falls to −0.5V. Accordingly, the PMOS transistors TP1 and TP2 are turned on, and the nodes N2 and NO fall to 0V, thereby turning off the PMOS transistors TP1 and TP2.

Figure 12:
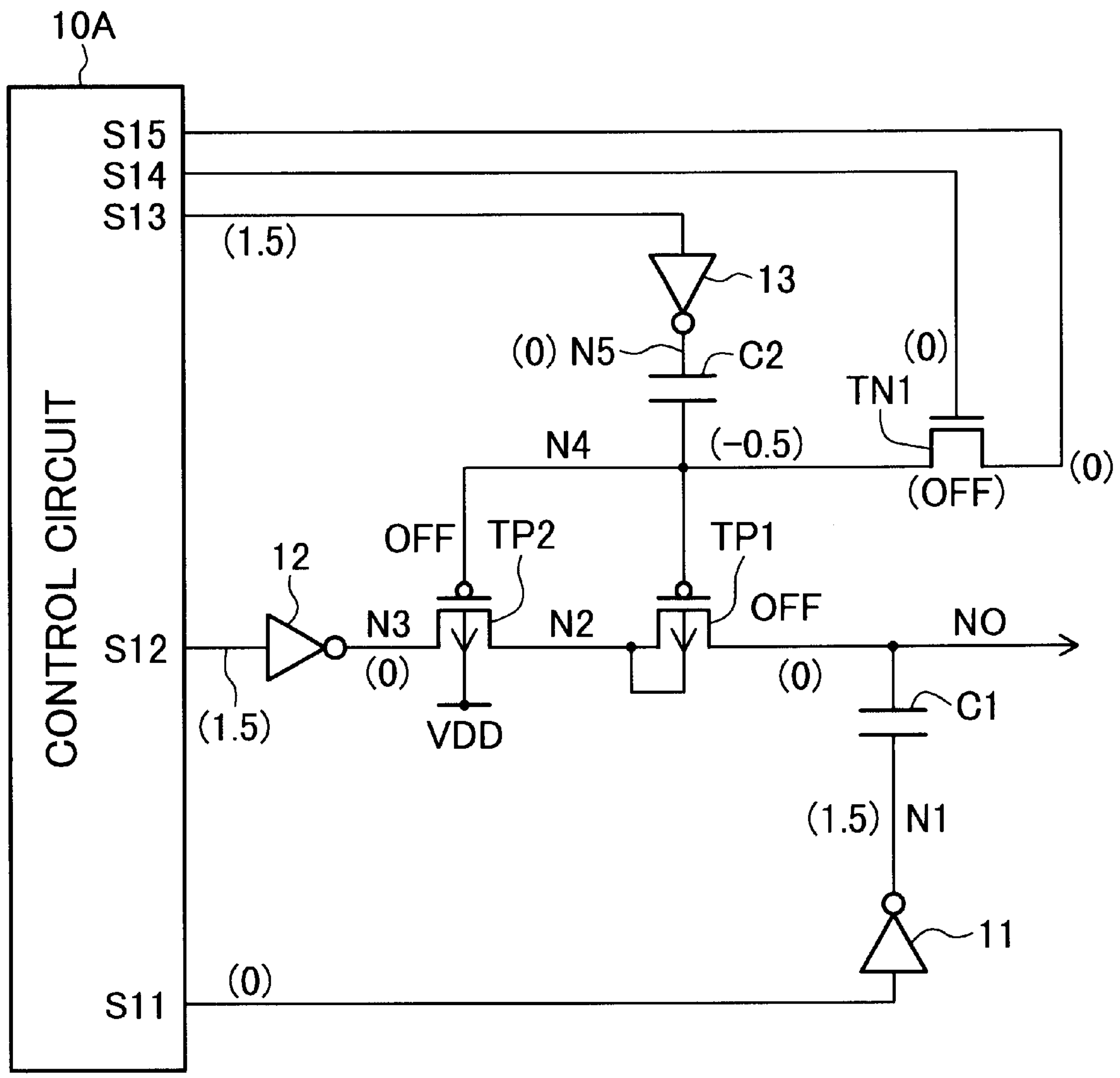
FIG. 12 is a diagram showing the voltages of nodes and the ON/OFF states of transistors in the same circuit as FIG. 8 at the end of step C of FIG. 9.

As a result of such an operation, the voltages of nodes and the ON/OFF states of transistors are set as shown in FIG. 12.

STEP D (NO: 0V→−1V)

(t8) The control signals S14 and S15 rise to 1.5V, turning on the NMOS transistor TN1, and thereby the node N4 rises to 1.5−Vthn=1V, turning off the NMOS transistor TN1. The control signal S11 rises to 1.5V, and thereby the node N1 falls to 0V, and following this, the output node NO in a floating state falls to −VDD+α5=−1V. At this time, the PMOS transistors TP1 and TP2 are OFF.

Such an operation removes the necessity of employing a transistor of complicated structure and allows reduction of the manufacturing cost of a semiconductor chip on which the voltage generation circuit is formed.

(t9) The control signal S15 falls to 0V, turning on the NMOS transistor TN1, and thereby the node N4 falls to 0V. In addition, the control signal S13 falls to 0V, and the node N5 rises to 1.5V.

(t10) The control signal S14 falls to 0V, turning off the NMOS transistor TN1.

Figure 13:
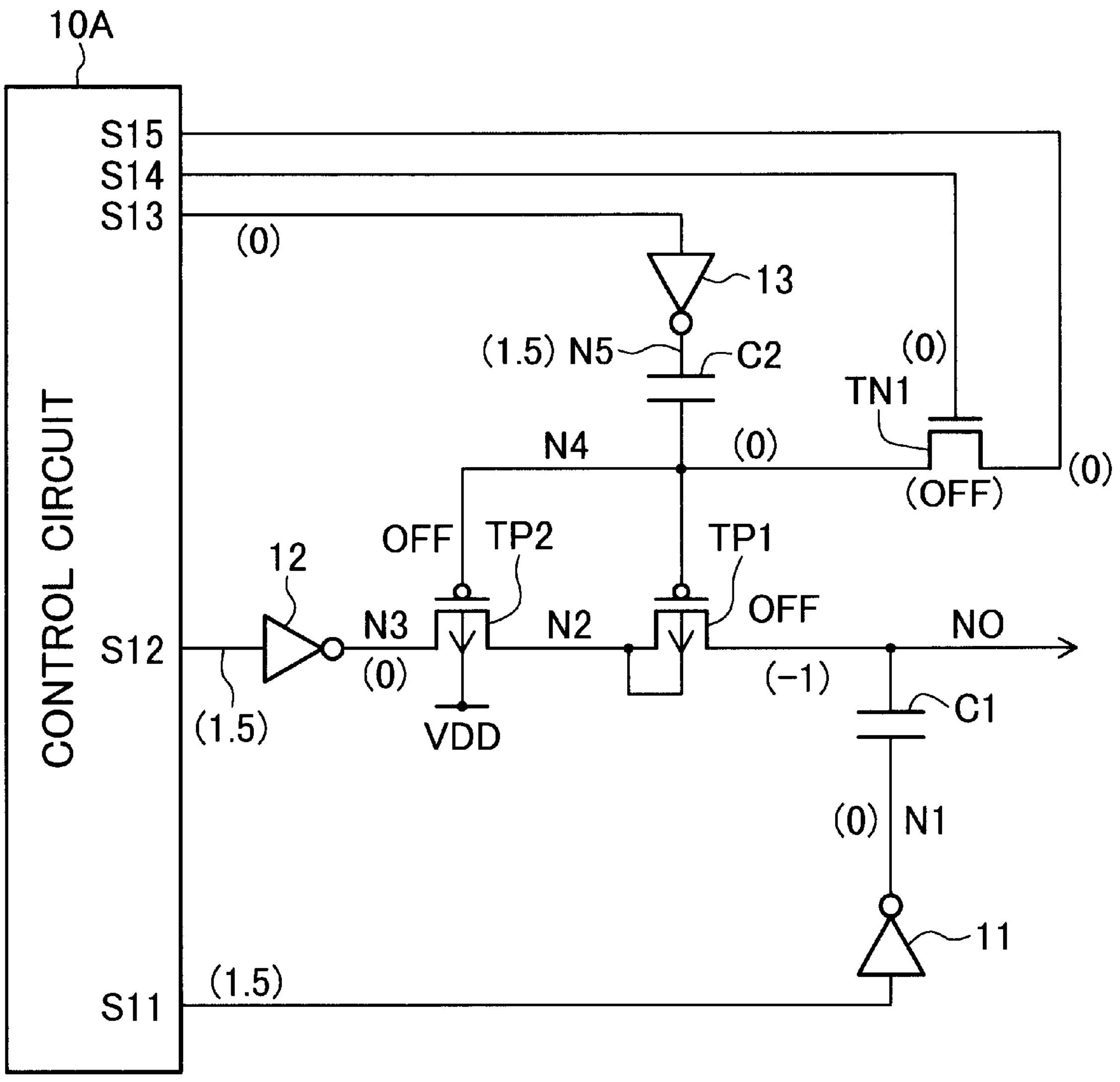
FIG. 13 is a diagram showing the voltages of nodes and the ON/OFF states of transistors in the same circuit as FIG. 8 at the end of step D of FIG. 9.

As a result of such an operation, the voltages of nodes and the ON/OFF states of transistors are set as shown in FIG. 13.

STEP E (NO: −1V→0V)

(t11) The control signal S15 falls to −0.5V. The control signal S13 rises to 1.5V, and thereby the node N5 falls to 0V, and following this, the node N4 falls to −VDD+α4=−1V. Accordingly, the PMOS transistor TP1 is turned on, then the PMOS transistor TP2 is turned on, and the output node NO rises to 0V.

Figure 14:
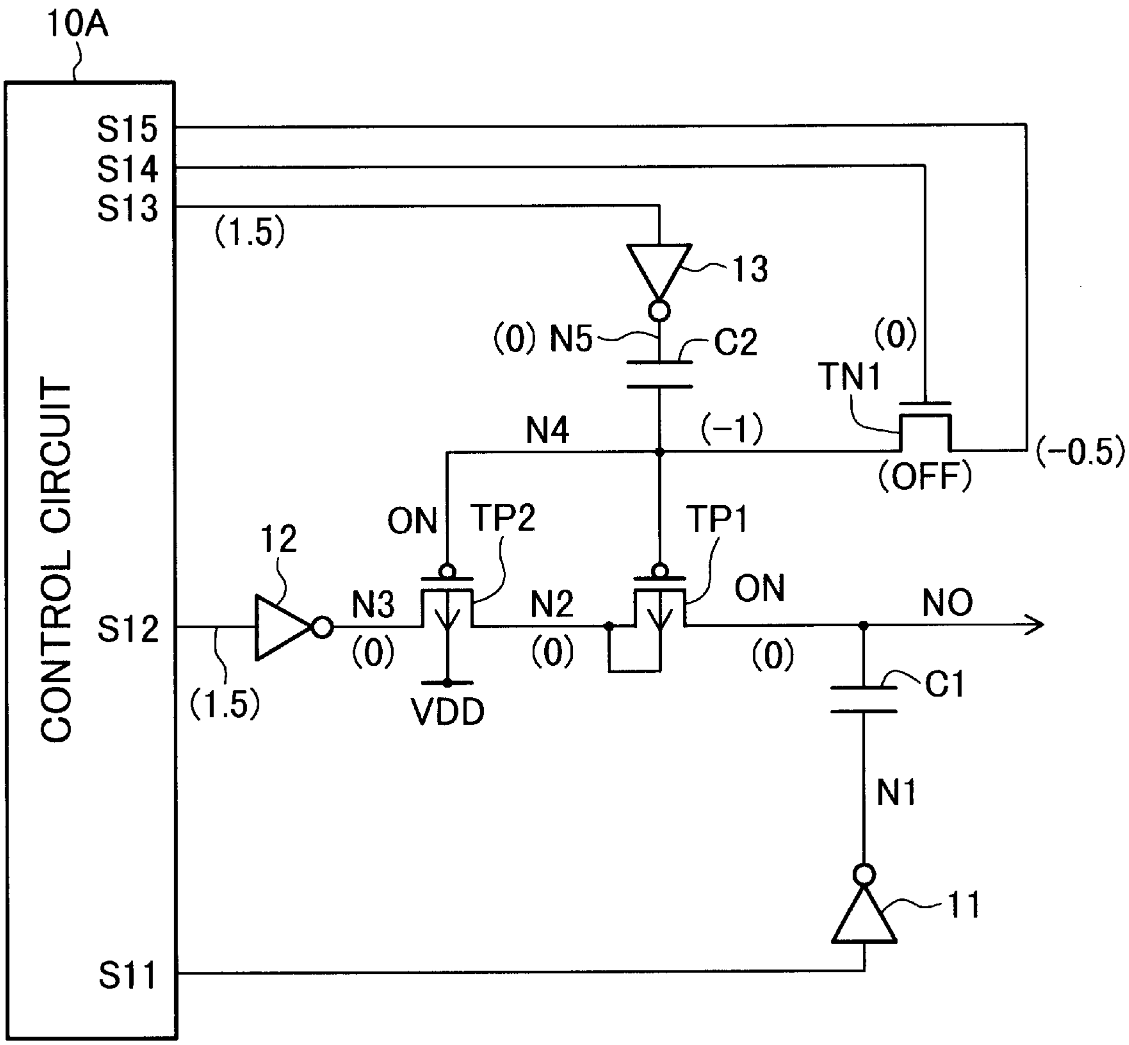
FIG. 14 is a diagram showing the voltages of nodes and the ON/OFF states of transistors in the same circuit as FIG. 8 at the end of step E of FIG. 9.

As a result of such an operation, the voltages of nodes and the ON/OFF states of transistors are set as shown in FIG. 14.

The second embodiment has the same advantage as that of the first embodiment.

Although preferred embodiments of the present invention have been described, it is to be understood that the invention is not limited thereto and that various changes and modifications may be made without departing from the spirit and scope of the invention.

What is claimed is:

1. A voltage generation circuit for selectively generating a low voltage lower than a first power supply voltage and a high voltage higher than a second power supply voltage on an output node on the basis of the first and second power supply voltages, the second power supply voltage being higher than the first power supply voltage, the voltage generation circuit comprising:

- a first PMOS transistor, having a current path and a control gate, a first end of the current path being connected to the output node, a back gate thereof being connected to a second end of the current path;
- a first NMOS transistor, having a current path and a control gate, a first end of the current path thereof being connected to the second end of the current path of the first PMOS transistor, a second end of the current path thereof being connected to the first power supply voltage;
- a first capacitor, having first and second electrodes, the first electrode being connected to the output node;
- a second PMOS transistor, having a current path and a control gate, a first end of the current path thereof being connected to the output node, a back gate thereof being connected to a second end of the current path thereof, the control gate thereof being connected to the first power supply voltage;
- a second NMOS transistor, having a current path and a control gate, a first end of the current path thereof being connected to the second end of the current path of the second PMOS transistor; and a control circuit configured to:

raise the second electrode of the first capacitor to the second power supply voltage to step up the output node to the high voltage from a first state where the first and second NMOS transistors are OFF and where the output node and the second electrode of the first capacitor are at the second and first power supply voltages, respectively; and lower the second electrode of the first capacitor to the first power supply voltage to step down the output node to the low voltage from a second state where the first and second NMOS transistors are OFF, where a voltage between the control gate and the second end of the current path of each of the first and second PMOS transistors is equal to an absolute value of a threshold voltage thereof, and where the output node and the second electrode of the first capacitor are at the first and second power supply voltages, respectively.

2. The voltage generation circuit according to claim 1, wherein the control circuit is configured to set each of the control gates of the first PMOS transistor and the first and second NMOS transistors to the first power supply voltage in the first state.

3. The voltage generation circuit according to claim 1, wherein the control circuit is configured to set each of the control gate voltages of the first and second NMOS transistors to the first power supply voltage in the second state.

4. The voltage generation circuit according to claim 2, wherein the control circuit is configured to set each of the control gate voltages of the first and second NMOS transistors to the first power supply voltage in the second state.

5. The voltage generation circuit according to claim 2, further comprising:

a third PMOS transistor, having a current path and a control gate, a first end of the current path thereof being connected to the control gate of the first PMOS transistor, a back gate and the control gate thereof being connected to the second and first power supply voltages, respectively; and a second capacitor, having first and second electrodes, the first electrode thereof being connected to the control gate of the first PMOS transistor, wherein the control circuit is configured to set both the second end of the current path of the third PMOS transistor and the second electrode of the second capacitor to the first power supply voltage in the first state.

6. The voltage generation circuit according to claim 5, wherein the control circuit is configured to, in the second state,:

raise the second electrode of the second capacitor from the first power supply voltage to the second power supply voltage; and raise the second end of the current path of the third PMOS transistor from the first power supply voltage to the second power supply voltage, and thereafter return the second end of the current path of the third PMOS transistor to the first power supply voltage.

7. The voltage generation circuit according to claim 1, wherein the control circuit is further configured to:

raise the second end of the current path of the second NMOS transistor from the first power supply voltage to the second power supply voltage to turn on the second NMOS transistor and the second PMOS transistor so as to bring the output node to the second power supply voltage in a third state where the first and second NMOS transistors are OFF and where both the output node and the second electrode of the first capacitor are at the first power supply voltage; and turn on the first NMOS transistor to bring the output node to the first power supply voltage in a fourth state where the first and second NMOS transistors are OFF and where the first PMOS transistor is ON.

8. The voltage generation circuit according to claim 2, wherein the control circuit is further configured to:

raise the second end of the current path of the second NMOS transistor from the first power supply voltage to the second power supply voltage to turn on the second NMOS transistor and the second PMOS transistor so as to bring the output node to the second power supply voltage in a third state where the first and second NMOS transistors are OFF and where both the output node and the second electrode of the first capacitor are at the first power supply voltage; and turn on the first NMOS transistor to bring the output node to the first power supply voltage in a fourth state where the first and second NMOS transistors are OFF and where the first PMOS transistor is ON.

9. The voltage generation circuit according to claim 3, wherein the control circuit is further configured to:

raise the second end of the current path of the second NMOS transistor from the first power supply voltage to the second power supply voltage to turn on the second NMOS transistor and the second PMOS transistor so as to bring the output node to the second power supply voltage in a third state where the first and second NMOS transistors are OFF and where both the output node and the second electrode of the first capacitor are at the first power supply voltage; and turn on the first NMOS transistor to bring the output node to the first power supply voltage in a fourth state where the first and second NMOS transistors are OFF and where the first PMOS transistor is ON.

10. The voltage generation circuit according to claim 4, wherein the control circuit is further configured to:

raise the second end of the current path of the second NMOS transistor from the first power supply voltage to the second power supply voltage to turn on the second NMOS transistor and the second PMOS transistor so as to bring the output node to the second power supply voltage in a third state where the first and second NMOS transistors are OFF and where both the output node and the second electrode of the first capacitor are at the first power supply voltage; and turn on the first NMOS transistor to bring the output node to the first power supply voltage in a fourth state where the first and second NMOS transistors are OFF and where the first PMOS transistor is ON.

11. The voltage generation circuit according to claim 5, wherein the control circuit is further configured to:

raise the second end of the current path of the second NMOS transistor from the first power supply voltage to the second power supply voltage to turn on the second NMOS transistor and the second PMOS transistor so as to bring the output node to the second power supply voltage in a third state where the first and second NMOS transistors are OFF and where both the output node and the second electrode of the first capacitor are at the first power supply voltage; and turn on the first NMOS transistor to bring the output node to the first power supply voltage in a fourth state where the first and second NMOS transistors are OFF and where the first PMOS transistor is ON.

12. The voltage generation circuit according to claim 6, wherein the control circuit is further configured to:

raise the second end of the current path of the second NMOS transistor from the first power supply voltage to the second power supply voltage to turn on the second NMOS transistor and the second PMOS transistor so as to bring the output node to the second power supply voltage in a third state where the first and second NMOS transistors are OFF and where both the output node and the second electrode of the first capacitor are at the first power supply voltage; and turn on the first NMOS transistor to bring the output node to the first power supply voltage in a fourth state where the first and second NMOS transistors are OFF and where the first PMOS transistor is ON.

13. A voltage generation circuit for selectively generating a low voltage lower than a first power supply voltage and a high voltage higher than a second power supply voltage on an output node on the basis of the first and second power supply voltages, the second power supply voltage being higher than the first power supply voltage, the voltage generation circuit comprising:

a first PMOS transistor, having a current path and a control gate, a first end of the current path being connected to the output node, a back gate thereof being connected to a second end of the current path;

a second PMOS transistor, having a current path and a control gate, the control gate thereof being connected to the control gate of the first PMOS transistor, a first end of the current path thereof being connected to the second end of the current path of the first PMOS transistor, a back gate thereof being connected to the second power supply voltage;

a first capacitor, having first and second electrodes, the first electrode being connected to the output node; and a control circuit configured to:

raise the second electrode of the first capacitor to the second power supply voltage to step up the output node to the high voltage in a first state where the first and second PMOS transistors are OFF and where the output node and the second electrode of the first capacitor are at the second and first power supply voltages, respectively; and lower the second electrode of the first capacitor to the first power supply voltage to step down the output node to the low voltage in a second state where the first and second PMOS transistors are OFF and where the output node and the second electrode of the first capacitor are at the first and second power supply voltages, respectively.

14. The voltage generation circuit according to claim 13, wherein the control circuit is configured to, in the first state,:

set the control gate of each of the first and second PMOS transistors to a voltage lower than a sum of the high voltage and a threshold voltage of the first or second PMOS transistor; and set a second end of the current path of the second PMOS transistor to the second power supply voltage.

15. The voltage generation circuit according to claim 13, wherein the control circuit is configured to set the control gates of the first and second PMOS transistors and the second end of the current path of the second PMOS transistor to the first power supply voltage in the second state.

16. The voltage generation circuit according to claim 14, wherein the control circuit is configured to set the control gates of the first and second PMOS transistors and the second end of the current path of the second PMOS transistor to the first power supply voltage in the second state.

17. The voltage generation circuit according to claim 14, further comprising:

an NMOS transistor, having a current path and a control gate, a first end of the current path thereof being connected to the control gates of the first and second PMOS transistors; and a second capacitor, having first and second electrodes, the first electrode thereof being connected to the control gates of the first and second PMOS transistors.

18. The voltage generation circuit according to claim 15, further comprising:

an NMOS transistor, having a current path and a control gate, a first end of the current path thereof being connected to the control gates of the first and second PMOS transistors; and a second capacitor, having first and second electrodes, the first electrode thereof being connected to the control gates of the first and second PMOS transistors.

19. The voltage generation circuit according to claim 16, further comprising:

an NMOS transistor, having a current path and a control gate, a first end of the current path thereof being connected to the control gates of the first and second PMOS transistors; and a second capacitor, having first and second electrodes, the first electrode thereof being connected to the control gates of the first and second PMOS transistors.

* * * * *